US006985276B2

(12) United States Patent
Taguchi et al.

(10) Patent No.: US 6,985,276 B2
(45) Date of Patent: Jan. 10, 2006

(54) MAGNETOOPTIC ELEMENT EXPLOITING SPIN CHIRALITY

(75) Inventors: Yasujiro Taguchi, Tokyo (JP); Yoshio Kaneko, Chiba (JP); Yoshinori Tokura, Tokyo (JP); Naoto Nagaosa, Tokyo (JP)

(73) Assignees: National Institute of Advanced Industrial Science and Technology, Tokyo (JP); Japan Science and Technology Agency, Saitama (JP)

( * ) Notice: Subject to any disclaimer, the term of this patent is extended or adjusted under 35 U.S.C. 154(b) by 0 days.

(21) Appl. No.: 10/490,059

(22) PCT Filed: Mar. 20, 2002

(86) PCT No.: PCT/JP02/02677

§ 371 (c)(1), (2), (4) Date: Mar. 19, 2004

(87) PCT Pub. No.: WO03/032054

PCT Pub. Date: Apr. 17, 2003

(65) Prior Publication Data

US 2004/0245510 A1 Dec. 9, 2004

(30) Foreign Application Priority Data

Sep. 28, 2001 (JP) ............................ 2001-302005

(51) Int. Cl.
*G02F 1/09* (2006.01)

(52) U.S. Cl. ...................................................... 359/280

(58) Field of Classification Search ................ 359/245, 359/280, 321, 324; 252/299, 519.13; 369/13.02; 324/96, 244.1

See application file for complete search history.

(56) References Cited

U.S. PATENT DOCUMENTS 5,331,589 A * 7/1994 Gambino et al. ............. 365/88
6,540,940 B1 * 4/2003 Negoro et al. ......... 252/229.01

OTHER PUBLICATIONS

Y. Taguchi et al.; Science, vol. 291, No. 5513, pp. 2573-2576, Mar. 30, 2001. Cited in the PCT search report.
N. Nagaosa, Elsevier, Materials Science and Engineering, vol. B84, pp. 58-62, Jul. 2001. Cited in the PCT search report.

(Continued)

*Primary Examiner*—Georgia Epps
*Assistant Examiner*—Tuyen Tra
(74) *Attorney, Agent, or Firm*—Westerman, Hattori, Daniels & Adrian, LLP

(57) ABSTRACT

A magnetooptic element whose size is essentially that of a lattice, namely several angstroms in size of magnetic material and which at the same time has its exhibiting magnetooptic effect detectable is provided along with a magnetooptic disk, a memory device and a magnetooptical picture or image display with a storage capacity of several terabits per square inch or more, each using such a magnetooptic element. The magnetooptic element utilizes a gigantic effective magnetic filed based on a spin chirality formed by geometrically configuring the spin orientation and crystallographic structure of a certain solid material. The solid material exhibiting the spin chirality may be such as a pyrochlore type oxide compound whose chemical composition is represented by chemical formula: $A_2B_2O_7$ where A is a rare-earth element and B is a transition metal, or a pyrochlore type oxide compound whose chemical composition is represented by chemical formula: $(A_{1-x}C_x)_2B_2O_7$ where A is a rare-earth element, C is an alkali-earth metallic element and B is a transition metal and where $0<x<1$.

9 Claims, 7 Drawing Sheets

OTHER PUBLICATIONS

S. Iikubo et al.; Journal of the Physical Society of Japan, vol. 70, No. 1, pp-212-218, Jan. 2001. Cited in the PCT search report.
S. Yoshii et al.; Journal of the Physical Society of Japan, vol. 69, No. 12, pp. 3777-3780, Dec. 2000. Cited in the PCT search report.
T. Katsufuji et al.; Physical Review Letters, vol. 84, No. 9, pp. 1998-2001, Feb. 2000. Cited in the PCT search report.
Notification of Transmittal of Copies of Translation of the International Preliminary Examination Report dated Jul. 8, 2004 and received by our foreign associated on Jul. 12, 2004.

* cited by examiner (a)

(b)

MAGNETOOPTIC ELEMENT EXPLOITING SPIN CHIRALITY

TECHNICAL FIELD

The present invention relates to a magnetooptic element and in particular to a magnetooptic element that exhibits the magnetooptic effect of an unprecedentedly gigantic magnitude and which thus makes it possible to take out signals with a raised S/N ratio.

BACKGROUND ART

With the growth of the information industry, demands for increasing the storage or memory capacity in an information storage device have come to know no limits. For example, while storing a picture image requires an enormous amount of memory capacity, the future information industry is calling for storing highly detailed images, images enormous in number and dynamic picture images over an extended time period, much more than those at the present time.

Large-capacity information storage devices includes a magnetic memory or storage in which information is written and reproduced by utilizing the magnetooptic effect (Faraday effect or magnetooptic Kerr effect) and which being large in storage capacity is predicted to continue to be the leading information storage in the future as well. In order to meet with the demands in the future for increasing the memory capacity in such a magnetic storage, it is vital to make smaller the storage unit of information, namely the size of a memory device. And it is expected, for example, that an element of the memory device will have to be 30 nm (300 angstroms) in magnetic medium size to meet a requirement for 100 G bits/square inches in the year 2001 and 10 nm (100 angstroms) in magnetic medium size to meet a requirement for 1000 G bits/square inches in the year 2007.

It has so far been known that a magnetic material which exhibits the magnetooptic effect makes it possible to write and reproduce information, by using in a form of, for e.g., a magnetooptic disk. Increasing of the information storage capacity of a memory device requires making its element size smaller which, however, makes a readout signal smaller. Consequently, a magnetic material is made necessary that is larger in the magnetooptic effect exhibited in inverse proportion to the device size. As a measure taken to this end it has been proposed as shown in JP H05-135569 A to make a memory device utilizing the anomalous Hall effect that is an effect based on the spin-orbit interaction in a solid. While such magnetooptic effect have been found to exhibit the effect to a greater extent than the earlier devices, it is still necessary to have their element size as large as 100 angstroms, so, their exhibiting magnetooptic effect is far less sufficient in intensity to realize a memory with a storage capacity of several terabits per square inches or more needed in the future, which problems remain unsolved.

DISCLOSURE OF THE INVENTION

With the view to solving the abovementioned problems, it is a first object of the present invention to provide a magnetooptic element whose size is essentially that of a lattice, namely several angstroms in magnetic medium size and which at the same time has its exhibiting magnetooptic effect detectable.

It is a second object of the present invention to provide a magnetooptic disk, a memory device and a magnetooptical picture or image display with a storage capacity of several terabits per square inch or more, each using a magnetooptic element as mentioned above.

There is provided in accordance with the present invention a magnetooptic element exploiting spin chirality, characterized in that it utilizes an effective magnetic field based on the spin chirality.

It is also characterized in that the said spin chirality is formed by geometrically configuring the spin orientation and crystallographic structure of a solid material capable of generating the said effective magnetic field.

With the element so constructed, the transfer integral of conduction electrons coupled to localized spins according to the Hund's rule has degrees of freedom for amplitude and phase, the phase creating the vector potential, namely the gauge flux which in turn creates a gigantic effective magnetic field. Since a solid material is used which has a spin configuration and a crystallographic structure sufficient to sustain the gigantic effective magnetic field created by the gauge flux, namely which has the spin chirality, that gigantic effective magnetic field which corresponds to as high a flux density as 10,000 tesla can be utilized as the magnetooptic effect it brings about.

Therefore, the element even if reduced in size to as small as the lattice size or to several angstroms, is capable of exhibiting the magnetooptic effect of a magnitude that is sufficient to cause it to function as a storage element.

With the element specifically characterized, the said solid material capable of generating the said effective magnetic field based on the spin chirality can be a pyrochlore type oxide whose chemical composition is represented by chemical formula: $A_2B_2O_7$ where A is a rare-earth element and B is a transition metal.

With the element specifically characterized, the said solid material capable of generating the said effective magnetic field based on the spin chirality can also be a pyrochlore type oxide whose chemical composition is represented by chemical formula: $(A_{1-x}C_x)_2B_2O_7$ where A is a rare-earth element, C is an alkali-earth metallic element and B is a transition metal and where $0<x<1$.

With the element specifically characterized, the said solid material capable of generating the said effective magnetic field based on the spin chirality may also have a spinel type crystallographic structure and is of a chemical composition represented by chemical formula: $AB_2X_4$ where A and B are each a metallic element and X is an element selected from the class which consists of oxygen, sulfur, selenium and tellurium.

With the element specifically characterized, the said solid material capable of generating the said effective magnetic field based on the spin chirality may also have a face-centered cubic crystal structure and is of a chemical composition represented by chemical formula: AB where A is a metallic element and B is an element selected from the class which consists of oxygen, sulfur, selenium and tellurium.

With the element specifically characterized, the said solid material capable of generating the said effective magnetic field based on the spin chirality may also have a perovskite type crystallographic structure with one having a superlattice structure, whose chemical composition is represented by chemical formula: $ABO_3$ where A is an alkali-earth metallic element or a rare-earth element and B is a transition metal.

When so made up of such a solid substance exhibiting the spin chirality, the element is capable of generating a gigantic effective magnetic field which corresponds to as high a flux density as 10,000 tesla and, therefore, even if reduced in size to as small as the lattice size or to several angstroms, it is capable of exhibiting the magnetooptic effect of a magnitude that is sufficient to allow it to function as a storage element.

The present invention further provides a magnetooptic disk, characterized by comprising a magnetooptic element as mentioned above. So constructed, a magnetooptic disk having a storage capacity as high as several terabits per square inch or more is made possible.

The present invention also provides a memory device comprising a magnetic thin film magnetized to store information therein and means for applying an electric current and a magnetic field to the said magnetic thin film to produce a Hall voltage therefrom whereby the stored information is read out, characterized in that a magnetooptic element as mentioned above is used as a said magnetic thin film. According to this makeup, since a gigantic Hall voltage is obtained based on the SC (spin chirality) anomalous Hall effect, a memory device is made possible having a storage density as high as several terabits per square inch or more.

The present invention further provides a picture or image display characterized by pixels which comprise magnetooptic elements as mentioned above. So made up, a picture or image display is made possible, whereby a picture or image can be written therein by a magnetic head or a laser light and can be displayed therefrom according to the presence/absence of a Faraday rotation or a Kerr effect which are obtainable by light exposure.

Also, using a solid substance exhibiting the spin chirality, a pixel even if reduced in size to several angstroms is allowed to function as that which is satisfactory.

BRIEF DESCRIPTION OF THE DRAWINGS

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof. In the drawings.

BEST MODES FOR CARRYING OUT THE INVENTION

Figure 1:
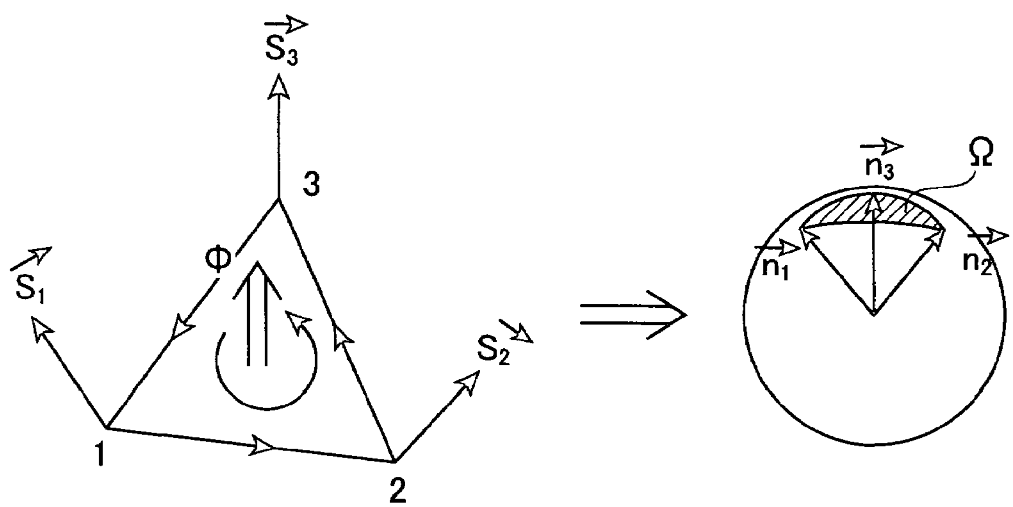
FIG. 1 is a diagram illustrating spin chirality and gauge flux.

Hereinafter, the present invention will be described in detail with reference to certain suitable forms of implementation thereof illustrated in the drawing figures.

The present inventors have discovered that the transfer integral of conduction electrons coupled to localized spins according to the Hund's rule has degrees of freedom for amplitude and phase, the phase creating the vector potential, namely the gauge flux which in turn creates a gigantic effective magnetic field and that if a solid material is used which has a spin configuration and a crystallographic structure not to cancel the gigantic effective magnetic field created by the gauge flux, namely which has the spin chirality, that gigantic effective magnetic field which corresponds to as high a flux density as 10,000 tesla can be utilized as the magnetooptic effect it brings about. Also, by actually observing what can be referred to as the SC anomalous Hall effect in such a solid material exhibiting the spin chirality (SC), the present inventors have verified such a gigantic effective magnetic field created by the gauge flux.

An explanation is given below in respect of the principles of operation of a magnetooptic element exploiting the spin chirality according to the present invention.

Consider conduction electrons coupled to localized spins according to the Hund's rule, the coupling being deemed to be by double exchange interaction. The matrix element (transfer integral) for a conduction electron hopping or moving from site i to site j is given by equation (1):

$$t_{ij}=t\{\cos(\theta_i/2)\cos(\theta_j/2)+\sin(\theta_i/2)\cos(\theta_j/2)\exp[\phi_i-\phi_j]\} \tag{1}$$

where θi, θj, ϕi and ϕj are polar coordinate components of spin directions.

This transfer integral is a complex number and has degrees of freedom for amplitude and phase. As for the amplitude, it is given by equation (2):

$$|t_{ij}|=t\cos(\theta_{ij}/2) \tag{2}$$

and is thus determined from an angle θij which two spins make. To maximize the gain of kinetic energy, it is seen that the spins are oriented parallel to each other and then a ferromagnetic interaction comes into play. The phase produces vector potential, namely gauge flux ϕ. An effective magnetic field produced by such gauge flux ϕ has a geometrical meaning. Now, consider three spins S1, S2 and S3 with a conduction electron hopping around along a loop: 1→2→→3→1 as shown in FIG. 1. A magnetic flux felt by the conduction electron is given by equation:

$$\Phi=\Omega/2 \tag{3}$$

namely being a half of the solid angle Ω formed by direction vectors $n_1$, $n_2$ and $n_3$ of the three spins on a unit spherical surface.

This means that if the crystal is assumed to have a lattice constant of 4 angstroms, it is possible to pass a magnetic flux of unit fluxoid quantum through an area of (4 angstroms)$^2$, which corresponds to a magnetic field of 10,000 tesla (wb/m$^2$). There is thus seen here an effect of the electron state that is placed under a magnetic field which is gigantic and extraordinarily larger compared with those of several hundred Tesla that can regularly be achieved on the laboratory scale. Such effective magnetic fields, however, exist as unevenly distributed ones which when averaged over crystal lattice unit cells disappear.

Figure 2:
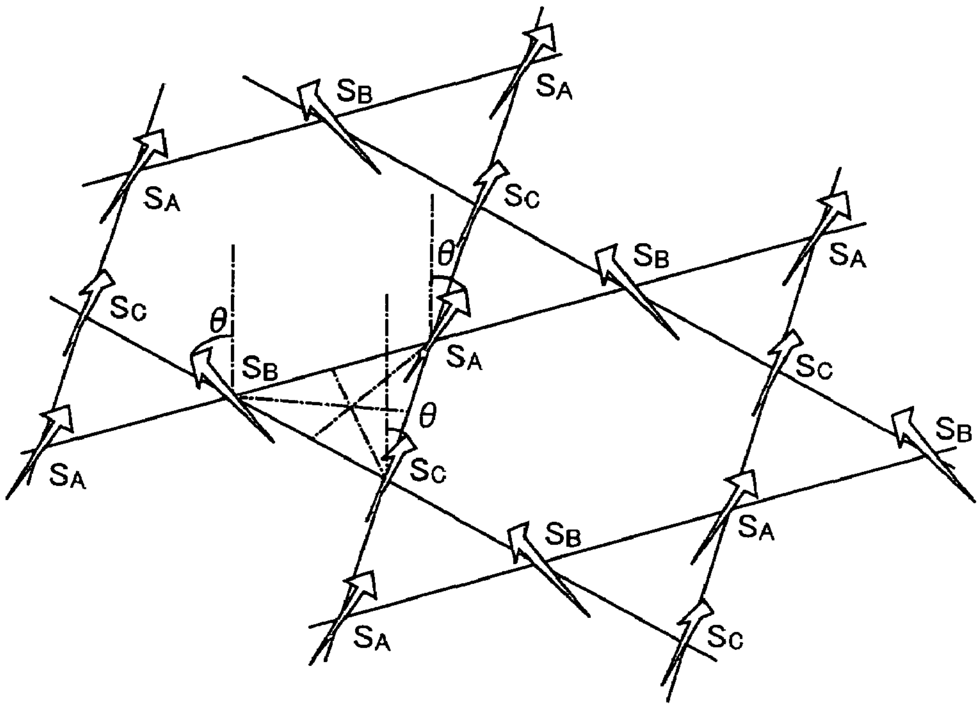
FIG. 2 diagrammatically illustrates spin orientations and gauge fluxes distributed on the Kagome lattice.
Figure 2:
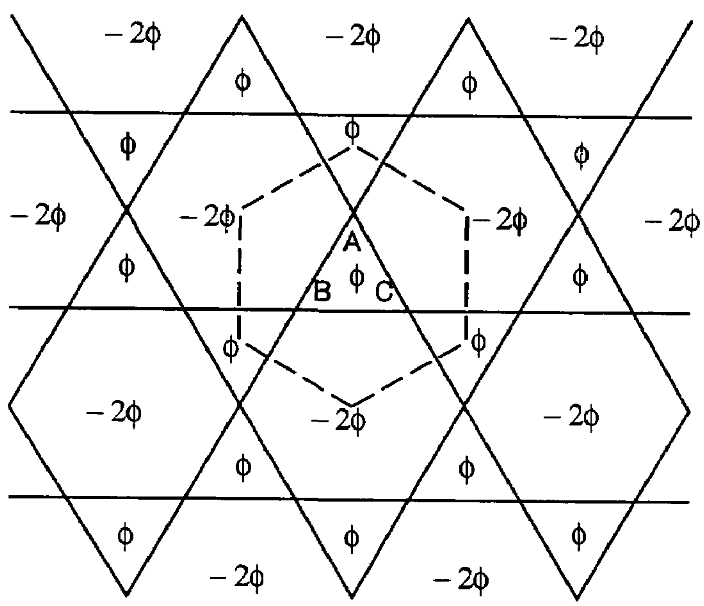
Figure 3:
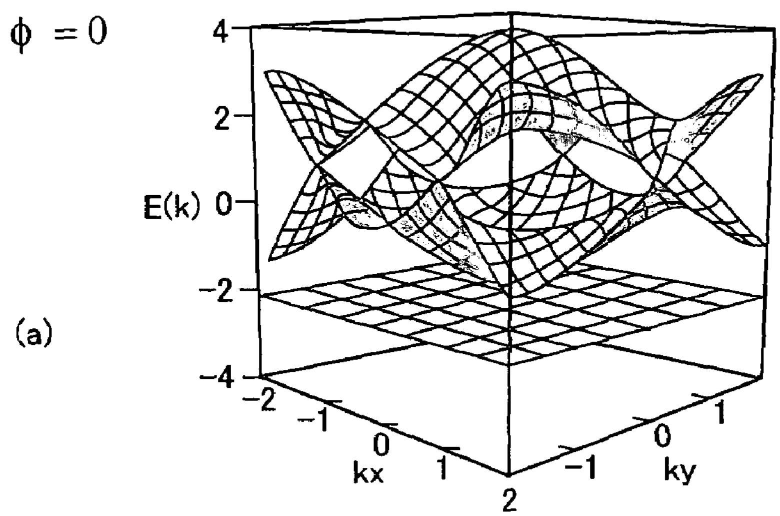
FIG. 3 diagrammatically illustrates the band dispersion in the tight binding model on the Kagome lattice in which (a) is where $\phi=0$ and (b) is where $\phi=\pi/3$.
Figure 3:
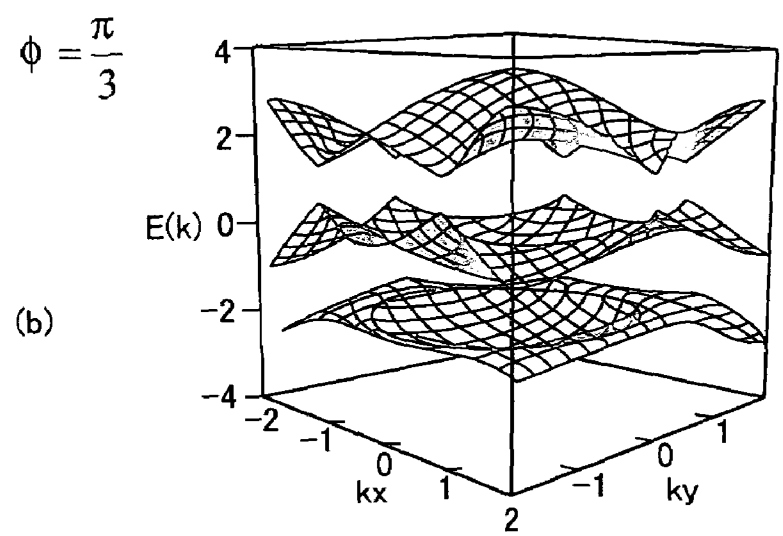

Nevertheless, a lattice configuration is found to exist in which such an uneven magnetic field stays without disappearing. One example of it is the Kagome lattice which is shown in FIG. 2. As shown in FIG. 2(*a*), in the Kagome lattice each lattice point has a spin $S_A$, $S_B$ or $S_C$ differently oriented to make an angle θ with the perpendicular to a lattice plane and a conduction electron has a spin oriented to align with these spin directions at such different lattice points, respectively. In this case, gauge fluxes ϕ are distributed as shown in FIG. 2(*b*). The inside surrounded with the dotted lines constitutes a unit cell, and the gauge fluxes ϕ when averaged within it certainly become zero. Considering, however, that three atoms A, B and C are contained in the unit cell, it is seen that three bands are generated accordingly. These bands are to feel gauge fluxes ϕ of plus (+) and minus (−) signs with different weights, and it is due to these different weights which brings about the SC anomalous Hall effect. An example of the computation of the band dispersions of these three bands in the tight binding model is shown in FIG. 3. These band dispersions indicate that they are gauge flux ϕ dependent. In FIG. 3, (a) is where ϕ=0 and (b) is where ϕ=π/3.

In the band dispersion diagram where ϕ=0, it is essential that a band crossing occur, and where it occurs a quantized Hall conductivity comes about.

The Hall conductivity in the Kagome lattice has an off diagonal component $\sigma_{xy}$ which can be derived from the linear response theory of equation (4) below (Kubo formula):

$$\sigma_{xy}(\omega) = -i\int_0^\infty d\tau e^{(-\delta+i\omega)\tau} Tr[\{Jx(\tau), Py\}\rho_{cd}] \tag{4}$$

to obtain the current density of fermions:

$$j_\mu = -e^2/(4\ \mathrm{h})\epsilon_{\mu\nu\lambda}F_{\mu\nu}\mathrm{sign}(m)$$

$$(F_{\mu\nu} = \partial_\mu A_\nu - \partial_\nu A_\mu) \tag{5}$$

This indicates that the Hall conductivity occurs as follows:

$$\sigma_{xy} = -e^2/(2\ \mathrm{h})\mathrm{sign}(m) \tag{6}$$

In this manner, if any least mass whatever exits, a quantized Hall conductivity is had with its sign changing according to that of the mass.

Thus, a magnetic monople exists at every band crossing point in where ϕ=0, namely at $K_1(k_x, k_y)=(2\pi/3, 0)$, $K_2(k_x, k_y)=(\pi/3, ¸3\ \pi/3)$ and K points equivalent to these points. To wit, in the presence of spin chirality, a band crossing point acts as a topological singular point and comes to be observed as a Hall conductivity.

In this way, the presence of a band crossing point is a basis to reason that with the lattice having a lattice constant of 4 angstroms, it is possible to pass the magnetic flux of a unit quantum magneton through the area of (4 angstroms)$^2$ as mentioned above. From this, it becomes possible in the presence of a spin chirality to see an effect of the electron state amounting to as high a magnetic field as 10,000 Tesla (wb/m$^2$). It shows that a certain band structure in a magnetic solid material gives its magnetic behavior an unobvious nature. The SC anomalous Hall conductivity $\sigma_{xy}$ comes to be expressed by equation (7) below:

$$\sigma_{xy} = e^2/(2\ \mathrm{h}) = 3\times10^{-1}\ \Omega^{-1}\mathrm{cm}^{-1} \tag{7}$$

This value of $\sigma_{xy}$ is in a two-dimensional case. In a theedimensional case, it can be divided by 4 Å to yield:

$$\sigma_{xy} = e^2/(4\ \mathrm{A}\ \alpha 2\ \mathrm{h}) = 1\times10^3\ \Omega^{-1}\mathrm{cm}^{-1} \tag{8}$$

as a magnitude.

The anomalous Hall effect so far known is based on a phenomenon called the Karplus-Luttinger type effect (or K-L type anomalous Hall effect), see R. Karplus and J. M. Luttinger, Pys. Rev. 95, 1154 (1954), and it is a first-order effect of a perturbation relating to the spin-orbit interaction. Contrary to such a conventional anomalous Hall effect, the SC anomalous Hall effect according to the present invention is unrelated to the spin-orbit interaction and, being a nonperturbative effect, is based on a topological phenomenon.

To wit, the SC anomalous Hall effect is an anomalous Hall effect brought about in an extremely peculiar structure, namely in a spin chirality structure, and is strikingly different from the conventional anomalous Hall effect based on K-L type anomalous Hall effects previously discovered.

Thus, the SC anomalous Hall effect can be brought about by realizing a geometrical configuration for spins in which the spin chirality exists. Namely, a solid material having spin orientations and a crystallographic structure geometrically configured so that it generates an effective magnetic field may be used. To this end, it is essential to choose a solid substance having a non-coplanar spin configuration in which spins are oriented to be non-coplanar. A typical material to meet this requirement is a pyrochlore type oxide for the reason that the crystal lattice of this substance when seen from the (1, 1, 1) crystallographic direction can be regarded as an three-dimensional extension of the Kagome lattice system described above. As will more fully be described in connection with specific Examples below, in this solid material system is the SC anomalous Hall effect actually taking place. Such spin chirality has also been found to be brought about in a spinel compound as well.

A magnetooptic element of the present invention, for which use is made of a solid material capable of exhibiting a gigantic effective magnetic field based on the operating principles described above, has its exhibiting magnetooptic effect detectable even if the solid material or magnetooptic element is reduced in size to a lattice size, namely to several angstroms in size. It follows, therefore, that a memory device using a magnetooptic element of the present invention is capable of functioning as a storage device even though its element is reduced in size to a lattice size, namely to several angstroms in size.

Next, Example 1 is shown below.

It is shown that the SC anomalous Hall effect has been found to occur in $Nd_2Mo_2O_7$ that is a pyrochlore type oxide and one of solid materials whose chemical composition is expressed by chemical formula: $A_2B_2O_7$ where A is a rare-earth element and B is a transition metal.

An $A_2B_2O_7$ type crystal of pyrochlore oxide has a geometrically frustrated structure having an A site and a B site forming sub-lattices, respectively. The A site lies at a position deviated from the B site structure by a half of the lattice constant. These sub-lattices as shown in FIG. 4 are each of a tetrahedral structure, having a corner in common.

Figure 4:
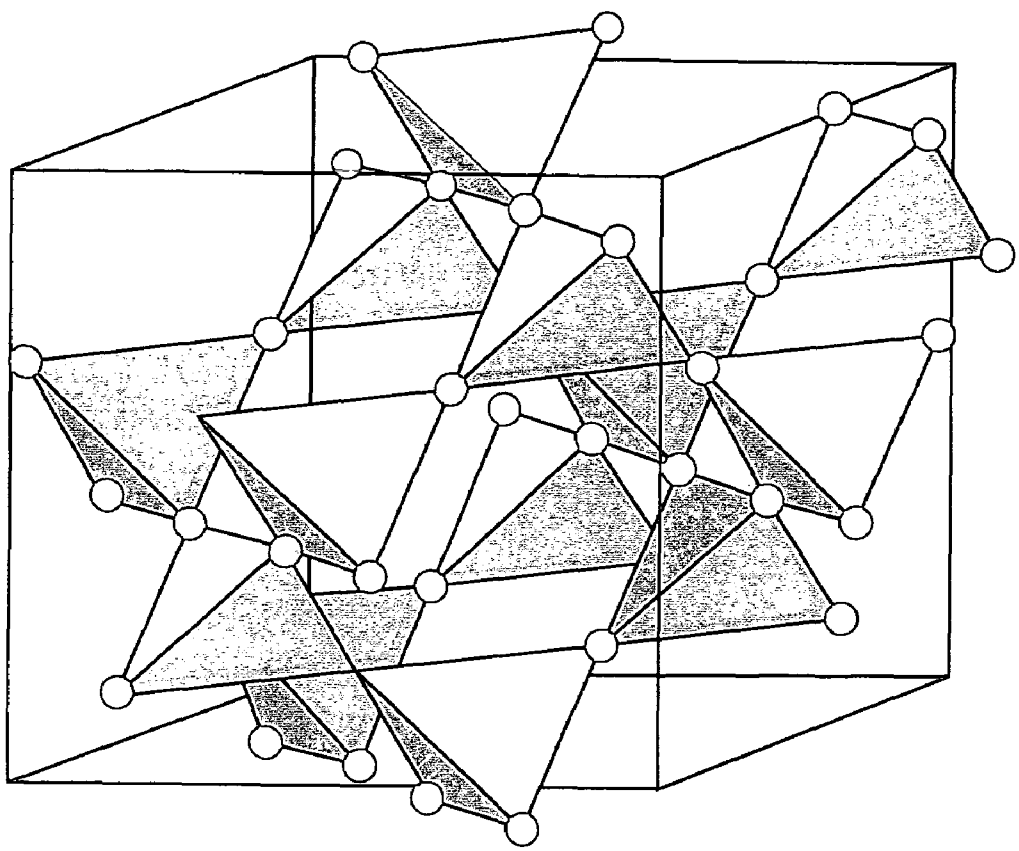
FIG. 4 diagrammatically illustrates a crystallographic structure of pyrochlore type oxide $Nd_2Mo_2O_7$ and a network of Mo atoms in which conduction electrons are present.

FIG. 4 shows a network of B(Mo) sites in which the ○(black circle) indicates a Mo atom. Such a bond of magnetic sites is magnetically frustrated and has a state like that of a spin glass.

On the other hand, A sites have a magnetic moment of rare earth 4*f* and have a magnetic domain of easy axis of magnetization at the center of the tetrahedron.

Figure 5:
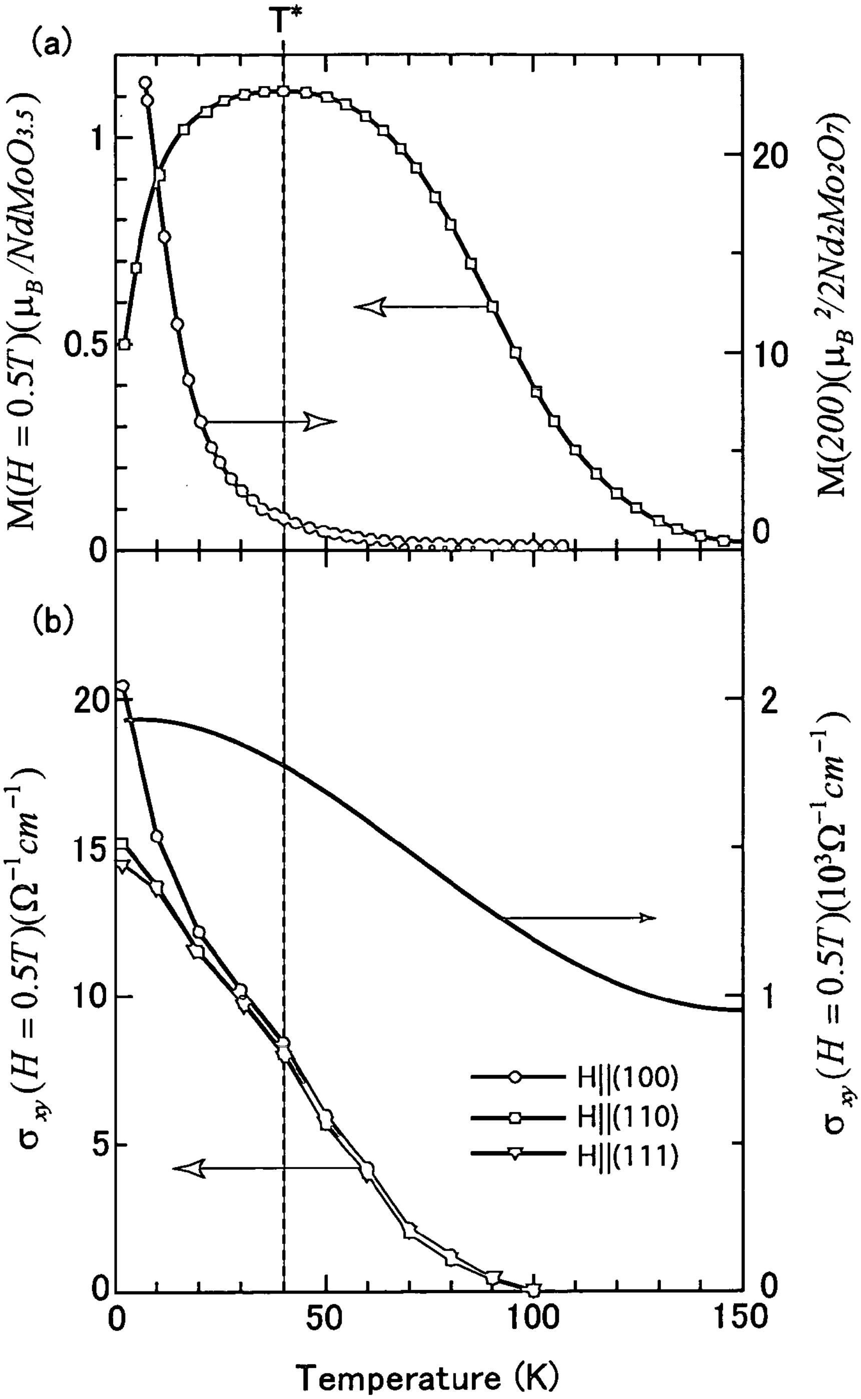
FIG. 5 is a graph showing results of measurement of temperature dependencies of the Hall conductivity, the magnetic susceptibility and the neutron diffraction of pyrochlore type oxide $Nd_2Mo_2O_7$.

FIG. 5(*a*) shows temperature dependency of magnetization M of $Nd_2Mo_2O_7$. At temperatures lower than Curie temperature 89 K, the magnetization increases rapidly according to the ferromagnetic ordering of Mo spins. As the temperature lowers from 40 K, the magnetization decreases rapidly because of the spin moment of Nd growing antiferromagnetically relative to that of Mo.

FIG. 5(*b*) shows results of measurement of Hall conductivity $\sigma_{xy}$. As the temperature is decreased, $\sigma_{xy}$ quickly increases. Because of the moment of Nd being highly susceptible and easily reacting to magnetic field H, the magnetization M increases as the magnetic field H is increased. In a usual ferromagnetic material, $\sigma_{xy}$ becomes zero as a low temperature is reached.

Figure 6:
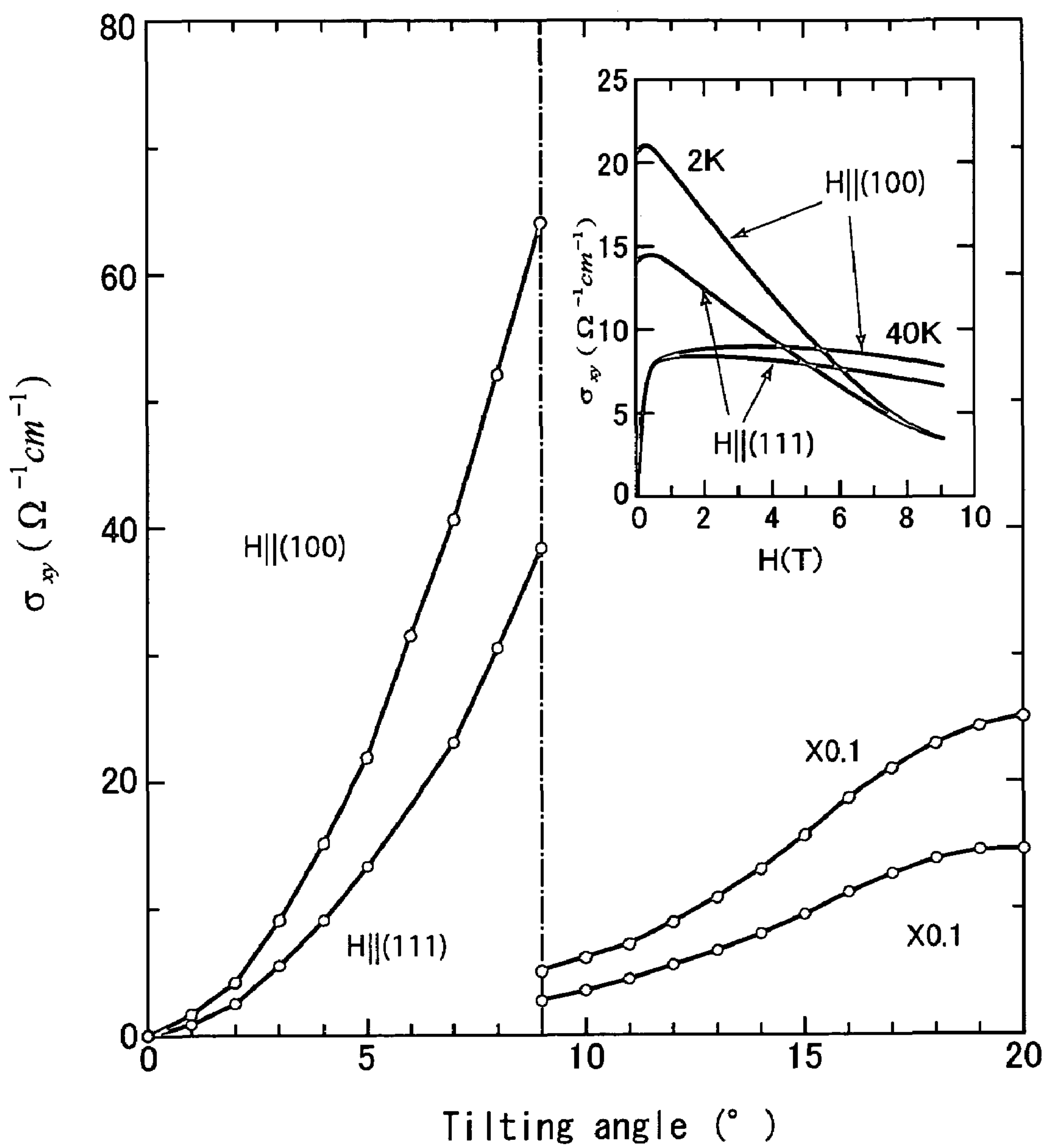
FIG. 6 is a graph showing results of theoretical calculation of the Hall conductivity of pyrochlore type oxide $Nd_2Mo_2O_7$ and results of measurement of its dependency from the magnetic field.

Hall conductivity a $\sigma_{xy}$ at the absolute zero temperature was calculated as a function of the tilting angle of the Mo spin upon integrating the same with the 40×40×40 momentum spaces into which the first Brillouin zone is divided. The results of the calculation are shown in FIG. 6, in which H ||(100) and H ||(111) indicate that the directions in which the magnetic field is applied are parallel to the (100) and (111) faces of the $Nd_2Mo_2O_7$ crystal, respectively.

It has been confirmed from neutron scattering that the tilting angle of the Mo spin in $Nd_2Mo_2O_7$ is 4 degrees. In the inset of FIG. 6 there is shown the experimentally derived dependency of Hall conductivity $\sigma_{xy}$ with magnetic field H. When the experimentally derived and theoretically calculated values at 2 K are compared, it is shown that the experimentally derived $\sigma_{xy}$ value at H=0 and the theoretically calculated a y value around the tilting angle of the Mo spin=4 degrees are in good agreement with each other. The Hall conductivity a $\sigma_{xy}$ at 2 K rapidly decreases when the magnetic field H is applied. This can be explained from the fact that the spin tilting angle becomes smaller and so does the spin chirality. It is shown that at 40 K the Hall conductivity $\sigma_{xy}$ is little dependent on the magnetic field, indicating that the temperature fluctuation effect of the magnetic moment cannot be held down by the magnetic field.

From these experimental data and results of theoretical analysis it is seen that in $Nd_2Mo_2O_7$ compound which is a pyrochlore oxide and one of solid substances having a chemical composition expressed by chemical formula $A_2B_2O_7$ where A is a rare-earth element and B is a transition metal there is brought about a totally new phenomenon so far unknown, namely the SC anomalous Hall effect by the generation of Mo spin chirality.

The fact that the tilting angle of the Mo spin in $Nd_2Mo_2O_7$ is 4 degrees and then the Hall conductivity $\sigma_{xy}$ has a value of about 20 $\Omega^{-1}cm^{-1}$ indicates that a gigantic anomalous Hall effect takes place. Also as seen magnetooptically, it is shown that even a size of several angstroms permits a detectable Kerr or Faraday rotation of the reflected or transmitted light to be obtained.

Example 2 is next shown.

It is shown that the SC anomalous Hall effect has been found to occur likewise in $(Sm_{0.9}Ca_{0.1})_2Mo_2O_7$ that is a pyrochlore type oxide and one of solid materials whose chemical composition is expressed by chemical formula: $(A_{1-x}C_x)_2B_2O_7$ where A is a rare-earth element, C is an alkali earth metallic element and B is a transition metal, and $0<x<1$.

Figure 7:
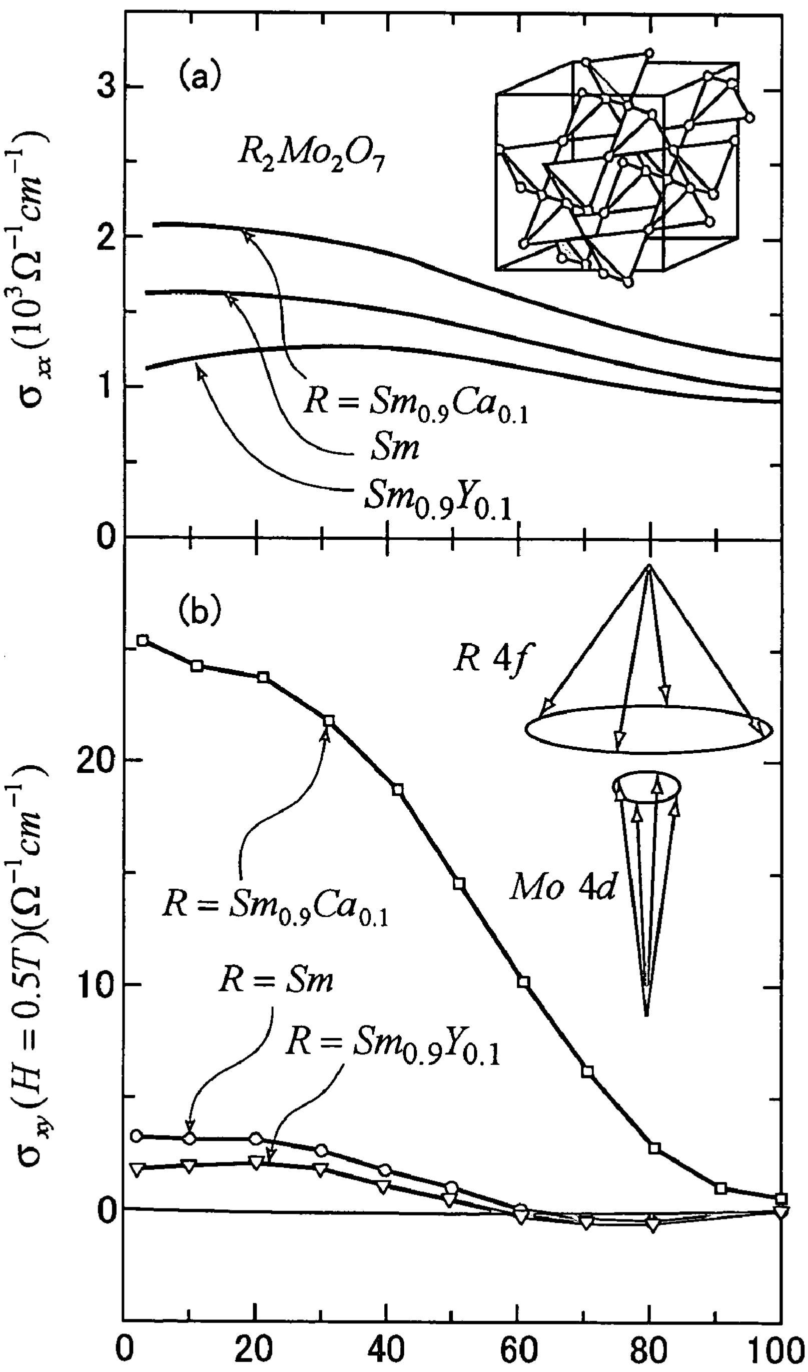
FIG. 7 is a graph illustrating results of measurement of temperature dependency of the Hall conductivity of $(Sm_{0.9}Ca_{0.1})_2Mo_2O_7$.

In FIG. 7 there are shown results of measurement of temperature dependency of the Hall conductivity of $(Sm_{1-x}Ca_x)_2Mo_2Mo_2O_7$ in cases where x=0.1 and x=0. The measurement was made with the magnetic field H=0.5 T. The normal Hall effect that is proportional to the magnetic field H is small and negligible.

From FIG. 7 it is seen that when Sm atoms are substituted with Ca atoms, the diagonal component $\sigma_{xx}$ of the Hall conductivity increases only up to at most 30% with temperature decrease but its off diagonal component $\sigma_{xy}$ increases to as high as 800% greater than that of the Ca undoped specimen.

In order to make clear what causes such a drastic increase of $\sigma_{xx}$ brought about by the Ca substitution, there are shown results of measurement of the Hall conductivity when Sm atoms are substituted with Y atoms in which no 4f electron exists. Since the ion radius of nonmagnetic atom Y is smaller than the ion radius of $Sm^{3+}$, the Y atoms only give rise to distortion of the crystal lattice while bringing about no change in the band occupation state of the electrons. In this case, as shown in the graph $\sigma_{xx}$ becomes somewhat smaller than that of Sm but $\sigma_{xy}$ dose not show anything more than usual. This must be thought to indicate that the substitution effect of Ca atoms is not due to the lattice distortion but to the hole doping by the absence of 4d electrons, and this effect ought to give a modulation to the spin network in the Mo sub-lattice. As a matter of fact, it has been confirmed that in the measurement of AC susceptibility of $(Sm_{0.9}Ca_{0.1})_2Mo_2O_7$, the frequency response increases as the temperature is decreased. This indicates that the ferromagnetic layers are in part converted into spin glass, and the presence of spin glass in effect increases the tilting angle of Mo spin and stresses the spin chirality. It can be stated, therefore, that the drastic increase of $\sigma_{xy}$ by Ca substitution here occurs due to occurrence of the SC anomalous Hall effect as in $Nd_2Mo_2O_7$.

In Example 1 it is shown that the spin chirality has been found to exit and the SC anomalous Hall effect has been observed in $Nd_2Mo_2O_7$ compound which is a pyrochlore oxide and one of the solid substances whose chemical composition is expressed by chemical formula: $A_2B_2O_7$ where A is a rare-earth element and B is a transition metal. Also, in Example 2 it is shown that the spin chirality has been found to exit and the SC anomalous Hall effect has been observed likewise in $(Sm_{0.9}Ca_{0.1})_2Mo_2O_7$ compound that is a pyrochlore type oxide and one of solid materials whose chemical composition is expressed by chemical formula: $(A_{1-x}C_x)_2B_2O_7$ where A is a rare-earth element, C is an alkali earth metallic element and B is a transition metal, and $0<x<1$.

The geometry exhibiting such spin chirality is also possible with an AB type compound of face-centered cubic structure. It is also possible with a compound consisting of $ABO_3$ type oxide of perovskite type structure and further with one having a super-lattice structure as well.

Using a magnetooptic element of the present invention as described above, it will be evident that a magnetooptic disk having a storage capacity as high as several terabits per square inch or more is made possible.

Using a magnetooptic element of the present invention as described above, it will also be evident that a memory device comprising a magnetic thin film magnetized to store information therein and means for applying an electric current and a magnetic field to the said magnetic thin film to produce a Hall voltage therefrom whereby the stored information is read out, is made possible as well, which has a storage density as high as several terabits per square inch or more.

Using a magnetooptic element of the present invention as described above, it will also be evident that a picture or image display with pixels formed of such elements is made possible as well, which has an increased resolution.

INDUSTRIAL APPLICABILITY

It will be appreciated from the foregoing description that according to the present invention, a magnetooptic element having its exhibiting magnetooptic effect detectable even if its material size is reduced to a lattice size, namely to several angstroms, is made possible.

The present invention also makes it possible to use a magnetooptic element of the present invention to build a magnetooptic disk or memory device therefrom so that it has a storage density as high as several terabits per square inch or more, and further to build a picture or image display having an increased resolution with pixels formed of such elements.

To wit, using a solid material having spin orientations and a crystallographic structure geometrically configured to be capable of generating an effective magnetic field, namely a solid material exhibiting spin chirality, allows a gigantic magnetooptic effect not hitherto found realizable to be brought about in accordance with the present invention. The solid material exhibiting spin chirality can be a pyrochlore type solid material. It can also be a solid material having a spinel structure. Further, it can be one having a face-centered cubic lattice structure. It can also be a solid material having a perovskite structure when it is made to form a super-lattice structure. Thus, a magnetooptic element according to the present invention is realizable with a solid material that can be selected from those having a variety of crystallographic structures.

Such a gigantic magnetooptic effect as described is not a phenomenon that can be brought about only at a low temperature, but is allowed to occur at a room temperature which does not call for a special freezing medium. The use of a solid material operable at the room temperature is highly advantageous industrially. Using a gigantic magnetooptic effect, an element of the present invention can be made in the form of a thin film, making it possible to fabricate a memory device having a huge storage capacity in a terabit region by the thin film technique combined with a semiconductor high-integration process whereby it is made possible to provide huge memories suitable for information transmission and optical computers in the future. Also, being capable of producing the magnetooptic effect of as large a magnitude as it has hitherto been impossible to produce with a conventional magnetic element as small as this size, an element of the present invention fully possesses a function as a pixel as well and is thus applicable also as each of the elements to form an unprecedented picture or image display.

What is claimed is:

1. A magnetooptic element exploiting spin chirality, wherein the magnetooptic element utilizes an effective magnetic field based on the spin chirality which is formed by geometrically configuring the spin orientation and crystallographic structure of a solid material generating said effective magnetic field.

2. A magnetooptic element exploiting spin chirality as set forth in claim 1 wherein a solid material which generates said effective magnetic field based on the spin chirality is a pyrochlore type oxide whose chemical composition is represented by chemical formula: $A_2B_2O_7$ where A is a rare-earth element and B is a transition metal.

3. A magnetooptic element exploiting spin chirality as set forth in claim 1 wherein a solid material which generates said effective magnetic field based on the spin chirality is a pyrochlore type oxide whose chemical composition is represented by chemical formula: $(A_{1-x}C_x)_2B_2O_7$ where A is a rare-earth element, C is an alkali-earth metallic element and B is a transition metal and where $0<x<1$.

4. A magnetooptic element exploiting spin chirality as set forth in claim 1 wherein a solid material which generates said effective magnetic field based on the spin chirality has a spinel type crystallographic structure and is of a chemical composition represented by chemical formula: $AB_2X_4$ where A and B are each a metallic element and X is an element selected from the class which consists of oxygen, sulfur, selenium and tellurium.

5. A magnetooptic element exploiting spin chirality as set forth in claim 1 wherein a solid material which generates said effective magnetic field based on the spin chirality has a face-centered cubic crystal structure and is of a chemical composition represented by chemical formula: AB where A is a metallic element and B is an element selected from the class which consists of oxygen, sulfur, selenium and tellurium.

6. A magnetooptic element exploiting spin chirality as set forth in claim 1 wherein a solid material which generates said effective magnetic field based on the spin chirality has a perovskite type crystallographic structure having a super-lattice structure, whose chemical composition is represented by chemical formula: $ABO_3$ where A is an alkali-earth metallic element or a rare-earth element and B is a transition metal.

7. A magnetooptic disk, comprising a magnetooptic element as set forth in claim 1.

8. A memory device comprising a magnetic thin film magnetized to store information therein and means for applying an electric current and a magnetic field to said magnetic thin film to produce a Hall voltage therefrom whereby the stored information is read out, wherein a magnetooptic element as set forth in claim 1 is used as said magnetic thin film.

9. An image display comprising pixels which comprise magnetooptic elements as set forth in claim 1.

* * * * *